United States Patent
Durec et al.

[19]

[11] Patent Number: 6,104,227
[45] Date of Patent: Aug. 15, 2000

[54] RF MIXER CIRCUIT AND METHOD OF OPERATION

[75] Inventors: Jeffery C. Durec; David K. Lovelace, both of Chandler; Dennis L. Welty, Mesa, all of Ariz.

[73] Assignee: Motorola, Inc., Schaumburg, Ill.

[21] Appl. No.: 09/277,867

[22] Filed: Mar. 29, 1999

[51] Int. Cl.⁷ .................................................. G06F 7/44
[52] U.S. Cl. ........................................ 327/359; 327/356
[58] Field of Search ................................. 327/355–361, 327/113; 455/326, 330, 333

[56] References Cited

U.S. PATENT DOCUMENTS

| | | | |
|---|---|---|---|
| 4,388,540 | 6/1983 | Schreurs | 327/355 |
| 5,151,625 | 9/1992 | Zarabadi et al. | 327/356 |
| 5,826,182 | 10/1998 | Gilbert | 327/355 |
| 5,886,547 | 3/1999 | Durec et al. | 327/359 |

*Primary Examiner*—Toan Tran
*Attorney, Agent, or Firm*—Lanny L. Parker

[57] ABSTRACT

An RF mixer (10) provides signal gain in a transconductor block (12). A first transistor (36) is sized M times larger than a second transistor (18) to generate the desired signal gain. The gain of the RF mixer (10) is the value M times an output impedance $Z_{OUT}$ divided by an input impedance $Z_{IN}$. A first current ($I_{40}$) conducted by the first transistor (36) is matched to a sum of the second current ($I_{24}$) conducted by the second transistor (18) and a third current ($I_{28}$). The first current is supplied to a first differential transistor pair (46, 48) and the summed current is supplied to a second differential transistor pair (56, 58) to provide balance in switching circuit (50).

19 Claims, 2 Drawing Sheets

RF MIXER CIRCUIT AND METHOD OF OPERATION

BACKGROUND OF THE INVENTION

The present invention relates, in general, to analog amplifiers and, more particularly, to Radio Frequency (RF) downconverters or mixers.

Receiver circuits are used in a myriad of wireless communication applications such as cordless telephones, pagers, cable modems, and cellular telephones. A receiver circuit typically receives a Radio Frequency (RF) modulated signal from an antenna. The receiver includes an input low-noise amplifier followed by a filter and a mixer. The RF signals are transmitted at a high frequency and are received by the mixer. The mixer uses a local oscillator signal for down-converting the RF signal to an IF signal for additional processing. It is desirable to maintain the receiver sensitivity, linearity, and noise figure over a wide range of input signal levels and input frequencies.

RF mixers include a transconductor and a commutating stage switching section driven by signals from a local oscillator.

The transconductance of the RF mixer is set by the input impedance, which typically has a value of fifty ohms for RF circuits. The gain of the RF mixer is the product of the output impedance and the transconductance. Thus, the voltage gain of the RF mixer is limited by the transconductance value and the gain of the RF mixer is increased by increasing the output load impedance. However, the output load impedance is usually derived from a tuned circuit, which places a practical limit on the value of the output load impedance. When the output impedance is increased to provide higher gain, the Q of the tuned circuit is increased which causes the bandwidth of the RF mixer to be lowered.

Hence, a need exists for an RF mixer that has a wide band of operation, low noise, high gain, and high linearity while maintaining low current consumption when downconverting for dual-band RF applications.

DETAILED DESCRIPTION OF THE PREFERRED EMBODIMENT

Figure 1:
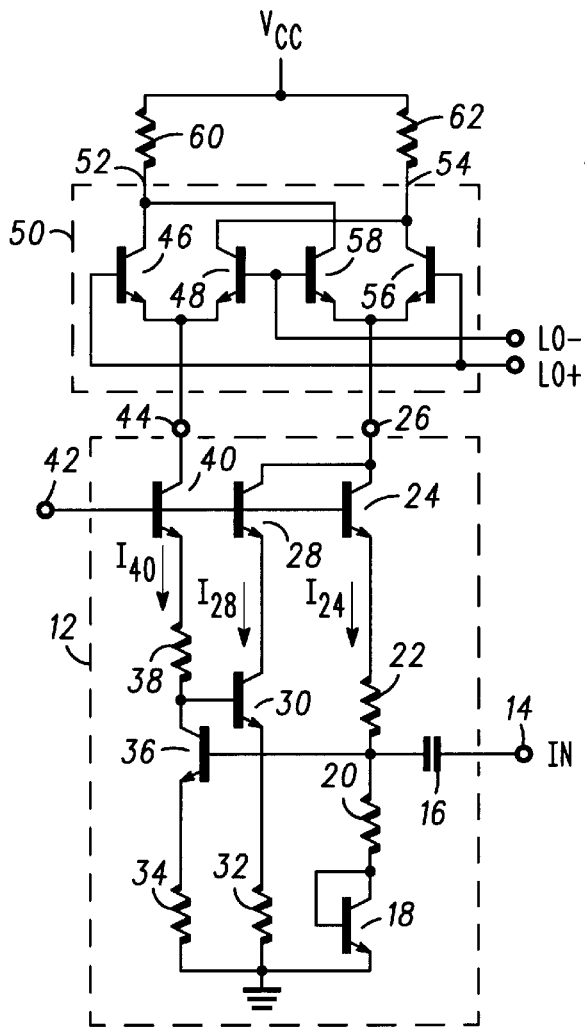
FIG. 1 is a schematic diagram showing the configuration of a single ended RF mixer.

FIG. 1 is a schematic diagram showing the configuration of a single ended Radio Frequency (RF) mixer 10. Many RF communication links use a frequency translation circuit to convert the high frequency signal to a lower frequency for processing. RF mixer 10 downconverts the high frequency signal and has wide band operation, low noise, high gain, high linearity, and maintains low current consumption. The signal gain of RF mixer 10 is controlled separately from the input impedance.

RF mixer 10 includes a transconductor block 12 having an input terminal 14, a bias terminal 42, and first and second terminals 26 and 44. Transconductor block 12 includes a transistor 18 having commonly connected base and collector terminals, and an emitter terminal connected to a first power conductor for receiving a bias voltage such as ground. A resistor 20 has a first terminal connected to the common base-collector terminals of transistor 18. A second terminal of resistor 20 is commonly connected to first terminals of a resistor 22. Terminal 14 receives the signal IN. A transistor 24 has an emitter terminal connected to a second terminal of resistor 22, having a resistance value of about sixty ohms. The collector terminal of transistor 24 is connected to a terminal 26 of transconductor block 12. A collector terminal of transistor 28 is also connected to terminal 26. The emitter terminal of transistor 28 is connected to a collector terminal of a transistor 30. The emitter terminal of transistor 30 is coupled to the first power conductor through a resistor 32, having a resistance value of about sixty ohms.

Transconductor block 12 further includes a transistor 36 having an emitter terminal coupled to the first power conductor through a resistor 34. The base terminal of transistor 36 is connected to the common connection of resistor 20, resistor 22, and capacitor 16. The collector terminal of transistor 36 is connected to the base terminal of transistor 30 and further coupled to the emitter terminal of a transistor 40 through a resistor 38. The collector terminal of transistor 40 is connected to terminal 44 of transconductor block 12. The base terminals of transistors 24, 28, and 40 are commonly connected to a terminal 42 of transconductor block 12 for receiving a bias voltage. A bias voltage ranging from about 1.5 to 1.8 volts is supplied at terminal 42.

RF mixer 10 further includes a commutating stage or switching circuit 50. Switching circuit 50 has first and second differential pairs. The first differential pair includes transistors 46 and 48, having commonly connected emitter terminals that are further connected to terminal 44. The second differential pair includes transistors 56 and 58, having commonly connected emitter terminals that are further connected to terminal 26. The base terminals of transistors 46 and 56 are coupled for receiving the signal LO+ and the base terminals of transistors 48 and 58 are coupled for receiving the signal LO−. The collector terminals of transistors 46 and 58 are connected to each other and to terminal 52. The collector terminals of transistors 48 and 56 are connected to each other and to terminal 54.

A resistor 60 has a first terminal connected to terminal 52 and a second terminal connected to a second power conductor for receiving a bias voltage such as VCC. A resistor 62 has a first terminal connected to terminal 54 and a second terminal connected to the second power conductor. Alternatively, resistors 60 and 62 could be replaced with inductors (not shown) and a capacitor placed between terminals 52 and 54.

The current $I_{40}$ is the collector current conducted by transistor 40, the current $I_{28}$ is the collector current conducted by transistor 28, and the current $I_{24}$ is the collector current conducted by transistor 24. The currents $I_{24}$ and $I_{28}$ are summed at terminal 26 and the summed current, by design, substantially equals the current $I_{40}$. Each of the currents $I_{24}$, $I_{28}$, and $I_{40}$ represent both a bias current and a signal current. Although the signal current portions of the currents $I_{24}$, $I_{28}$, and $I_{40}$ vary, the sum of the bias portions of the currents $I_{24}$ and $I_{28}$ substantially matches the bias portion of the current $I_{40}$.

In operation, the gain of RF mixer 10 is proportional to the product of a value M times $Z_{OUT}$ divided by $Z_{IN}$, where M is equal to the ratio of the resistance of resistor 34 divided by the resistance of resistor 20, $Z_{OUT}$ is the output impedance, and $Z_{IN}$ is the input impedance of RF mixer 10. When transistor 36 has an emitter area that is M times greater than the emitter area of transistor 18, a current $I_{40}$ is conducted by transistors 36 and 40 that is M times greater than the current $I_{24}$ conducted by transistors 18 and 24. After selecting the emitter areas of transistors 18 and 36 to achieve the desired signal gain, then the current $I_{28}$ conducted by transistors 28 and 30 is selected to have a value that corrects for any imbalance in currents at terminals 26 and 44. The current $I_{28}$ is set by the emitter area of transistor 30 and the resistor value of resistor 32. Thus, the sum of the currents $I_{24}$ and $I_{28}$ at terminal 26 matches the current $I_{40}$ at terminal 44. By matching the currents at terminals 26 and 44, the differential switching pairs, i.e., transistors 46–48 and 56–58, are balanced and the performance of RF mixer 10 is improved. Thus, the signal gain of RF mixer 10 is M times greater than prior art RF mixers that have gains limited to $Z_{OUT}$ divided by $Z_{IN}$.

RF mixer 10 provides signal gain prior to mixing the amplified input signal with the signals LO− and LO+ in switching circuit 50. Using the configuration of transconductor block 12, where transistors 18 and 24 have a reduced noise contribution because of the increased conduction currents $I_{28}$ and $I_{40}$, the noise figure of RF mixer 10 is decreased. Further, the Alternating Current (AC) $I_{40}$ lags the AC current $I_{24}$ because of the finite bandwidth of the transistors and current $I_{28}$ slightly lags the current $I_{40}$. Thus, the conduction path provided by transistors 28 and 30 help to insure that the signals at terminals 26 and 40 have a phase difference of 180 degrees when compared to one another.

Figure 2:
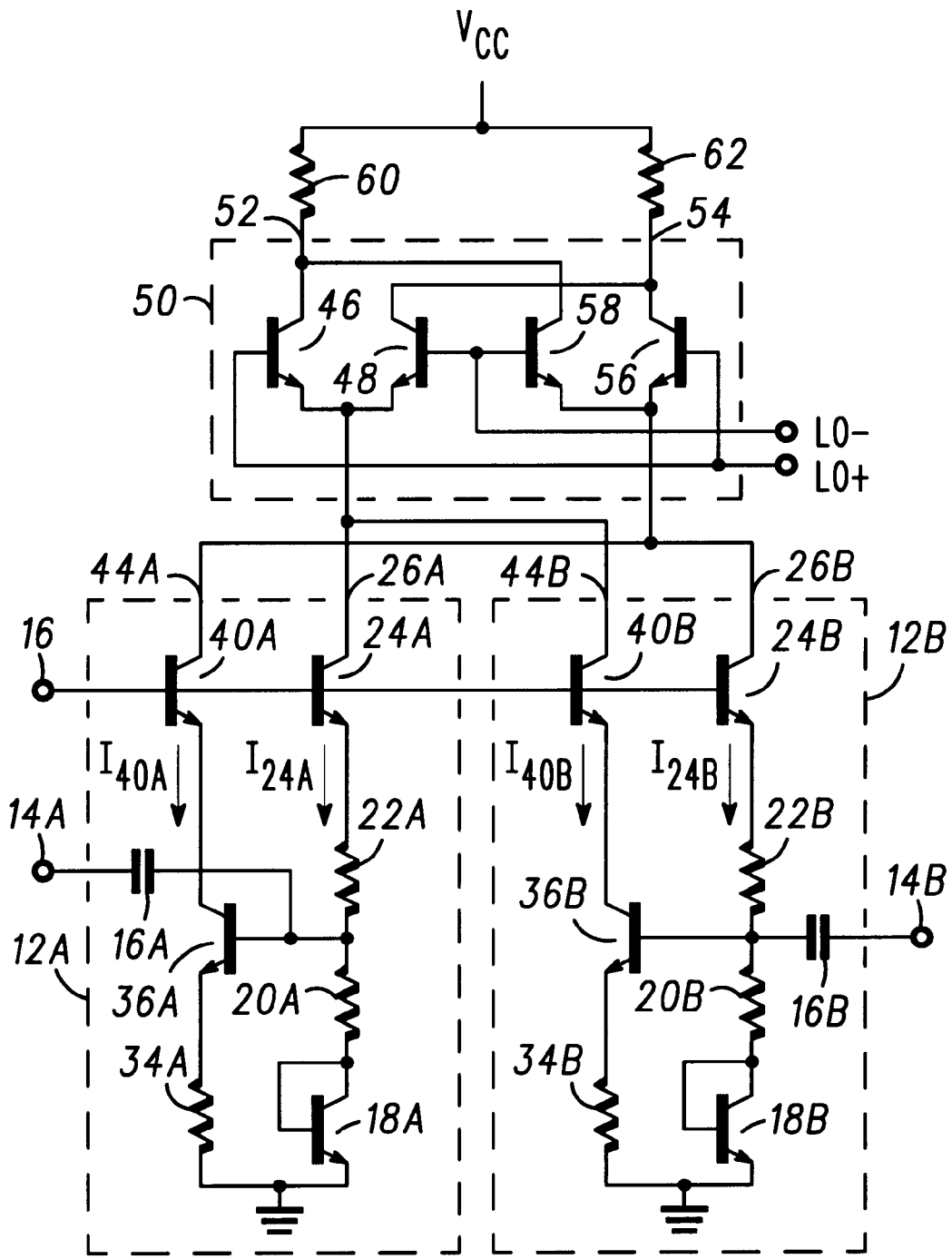
FIG. 2 is a block diagram showing the configuration of an RF mixer having differential inputs.

FIG. 2 is a block diagram showing the configuration of an 20 RF mixer 64 having differential inputs. It should be pointed out that the same reference numbers are used in the figures to denote the same elements. RF mixer 64 includes a first transconductor block 12A having a terminal 14A for receiving an input signal, an input terminal 16 for receiving a bias voltage, and terminals 44A and 26A. RF mixer 64 further includes a second transconductor block 12B having a terminal 14B for receiving an input signal, an input terminal 16 for receiving a bias voltage, and terminals 44B and 26B. RF mixer 64 as shown in FIG. 2 receives a differential signal at terminals 14A and 14B. The letters A and B have been appended to the reference numbers of the elements in respective transconductor blocks 12A and 12B to denote like elements as shown in FIG. 1.

The elements of transconductor block 12A have corresponding elements to the elements of transconductor block 12B. For instance, transconductor block 12A has transistors 18A, 24A, 36A, and 40A, and resistors 20A, 22A, and 34A. Transconductor block 12B has transistors 18B, 24B, 36B, and 40B, and resistors 20B, 22B, and 34B. The interconnect between the elements of transconductor block 12A is the same as the interconnect between the elements of transconductor block 12B. It should be noted that transconductor block 12 of FIG. 1 includes transistors 28 and 30 and resistors 32 and 38 that do not have corresponding devices in transconductor blocks 12A and 12B.

The current $I_{40A}$ is the collector current conducted by transistor 40A and the current $I_{24A}$ is the collector current conducted by transistor 24A. The current $I_{40B}$ is the collector current conducted by transistor 40B and the current $I_{24B}$ is the collector current conducted by transistor 24B. In this embodiment, the current $I_{40A}$ does not match the current $I_{24A}$. Likewise, the current $I_{40B}$ does not match the current $I_{24B}$. However, the sum of the currents $I_{40A}$ and $I_{24B}$ does substantially match the sum of the currents $I_{24A}$ and $I_{40B}$. The currents $I_{40A}$ and $I_{24B}$ are summed by connecting terminal 44A to 26B and the currents $I_{24A}$ and $I_{40B}$ are summed by connecting terminal 26A to 44B.

RF mixer 64 also includes a switching circuit 50 having first and second differential pairs. The first differential pair includes transistors 46 and 48, having commonly connected emitter terminals that are further connected to terminal 26A of transconductor block 12B and terminal 26A of transconductor block 12A. The second differential pair includes transistors 56 and 58, having commonly connected emitter terminals that are further connected to terminal 44A of transconductor block 12B and terminal 44A of transconductor block 12A. The base terminals of transistors 46 and 56 are coupled for receiving the signal LO+ and the base terminals of transistors 48 and 58 are coupled for receiving the signal LO−. The collector terminals of transistors 46 and 58 are connected to each other and to terminal 52. The collector terminals of transistors 48 and 56 are connected to each other and to terminal 54.

A resistor 60 has a first terminal connected to terminal 52 and a second terminal connected to a second power conductor for receiving a bias voltage such as VCC. A resistor 62 has a first terminal connected to terminal 54 and a second terminal connected to the second power conductor. Alternatively, resistors 60 and 62 could be replaced with inductors (not shown) and a capacitor placed between terminals 52 and 54.

In operation, the gain of mixer 64 is controlled separately from the input impedance of the mixer. The gain of RF mixer 64 is determined as the product of a value M times $Z_{OUT}$ divided by $Z_{IN}$, where M is the ratio of the emitter area of transistor 36A to the emitter area of transistor 18A, $Z_{OUT}$ is the output impedance, and $Z_{IN}$ is the input impedance of mixer 64. The emitter areas of transistors 36B and 18B in transconductor block 12B have the same ratio M as the emitter areas of transistors 36A and 18A in transconductor block 12A. When transistor 36A has an emitter area that is M times greater than the emitter area of transistor 18A, the current $I_{40A}$ conducted by transistors 36A and 40A is M times greater than the current $I_{24A}$ conducted by transistors 18A and 24A. Similarly, when transistor 36B has an emitter area that is M times greater than the emitter area of transistor 18B, the current $I_{40B}$ conducted by transistors 36B and 40B is M times greater than the current $I_{24B}$ conducted by transistors 18B and 24B. Thus, the signal gain of RF mixer 64 is M times greater than prior art RF mixers that have gains limited to $Z_{OUT}$ divided by $Z_{IN}$.

By connecting terminal 44A of transconductor block 12A with terminal 26B of transconductor block 12B, current $I_{40A}$ is summed with current $I_{24B}$. By connecting terminal 26A of transconductor block 12A with terminal 44B of transconductor block 12B, current $I_{24A}$ is summed with current $I_{40B}$. The sum of the currents $I_{40A}$ and $I_{24B}$ conducted by one of the differential transistor pairs matches the sum of the currents $I_{24A}$ and $I_{40B}$ conducted by the other differential transistor pair. By matching the currents to the differential transistor pairs, i.e., transistors 46–48 and 56–58, the performance of RF mixer 64 is improved.

Figure 3:
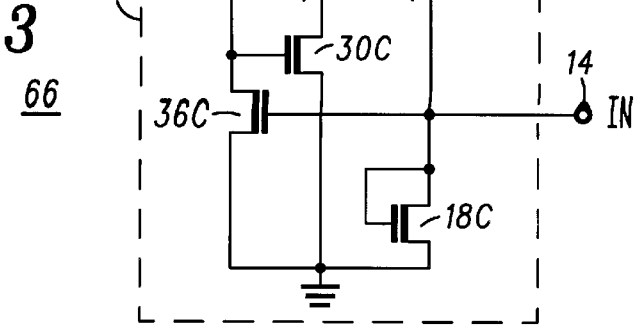
FIG. 3 is a schematic diagram showing the configuration of the single ended RF mixer of FIG. 1 using MOSFETs.

FIG. 3 is a schematic diagram showing the configuration of a single ended RF mixer 66 using MOSFETs. The configuration of RF mixer 66 is similar to the configuration of RF mixer 10 that is illustrated in FIG. 1. In this embodiment, the transistors shown in transconductor block 12 (FIG. 1) have been replaced by Metal Oxide Semiconductor Field Effect Transistors (MOSFETs). Thus, the bipolar transistors 18, 24, 28, 30, 36, and 40 of transconductor block 12 have been replaced in transconductor block 12C (FIG. 3) with MOSFETs 18C, 24C, 28C, 30C, 36C, and 40C, respectively. The letter C has been appended to the reference numbers to denote that the transistors are MOSFETs. The resistors that appear in transconductor block 12 (FIG. 1) have been eliminated from transconductor block 12C. It should be pointed out that MOSFET 40C could be a bipolar transistor in some embodiments. It should be further pointed out that the transistors in switching circuit 50 can be either bipolar transistors or MOSFETs.

The operation of RF mixer 66 is similar to the operation of RF mixer 10. The signal gain of RF mixer 66 is determined by setting the gate width of transistor 36C as M times the gate width of transistor 18C. The drain-to-source current $I_{40C}$ conducted by transistor 36C is about M times the drain-to-source current $I_{24C}$ conducted by transistor 18C. In this embodiment, the gate width of transistor 30C is selected such that the sum of the currents $I_{24C}$ and $I_{28C}$ substantially matches the current $I_{40C}$. By matching the currents to the differential transistor pairs, i.e., transistors 46–48 and 56–58, the performance of RF mixer 66 is improved. In addition, by selecting the gate widths of transistors 36C and 18C to have a ratio of M, the signal gain of RF mixer 66 is proportional to the product of a value M times $Z_{OUT}$ divided by $Z_{IN}$. Thus, the present invention has a signal gain that is M times greater than prior art RF mixers having gains limited to $Z_{OUT}$ divided by $Z_{IN}$.

FIG. 1 illustrates a bipolar embodiment of an RF mixer 10 and FIG. 3 illustrates the MOSFET embodiment. Although only a bipolar embodiment of RF mixer 64 has been illustrated and described, it should be noted that a MOSFET embodiment of FIG. 2 would involve replacing transconductor blocks 12A and 12B with two transconductor blocks 12C of FIG. 3.

By now it should be appreciated that an RF mixer has been provided that has a wide band of frequency operation when downconverting for dual-band RF applications. The configuration of the RF mixer provides a signal gain that is set independent of altering the output impedance. The currents to the differential transistor pairs of the switching circuit have been matched to improve the performance of RF mixer.

What is claimed is:

1. A mixer circuit, comprising:

first and second differential transistor pairs having control terminals coupled for receiving a first differential signal;

a first transistor having a control terminal coupled for receiving a first signal, a first conduction terminal coupled to conduction terminals of the first differential transistor pair, and a second conduction terminal coupled to a power conductor;

a second transistor having a control terminal and a first conduction terminal coupled to the control terminal of the first transistor and further coupled to conduction terminals of the second differential transistor pair, and a second conduction terminal coupled to the power conductor; and a third transistor having a control terminal coupled for receiving a second signal, a first conduction terminal coupled to the conduction terminals of the second differential transistor pair, and a second conduction terminal coupled to the power conductor.

2. The mixer circuit of claim 1, wherein the control terminal of the third transistor is coupled to the first conduction terminal of the first transistor.

3. The mixer circuit of claim 2, further comprising:

a fourth transistor having a control terminal coupled for receiving a bias, a first conduction terminal coupled to the conduction terminals of the first differential transistor pair, and a second conduction terminal coupled to the first conduction terminal of the first transistor;

a fifth transistor having a control terminal coupled for receiving the bias, a first conduction terminal coupled to the conduction terminals of the second differential transistor pair, and a second conduction terminal coupled to the first conduction terminal of the second transistor; and a sixth transistor having a control terminal coupled for receiving the bias, a first conduction terminal coupled to the conduction terminals of the second differential transistor pair, and a second conduction terminal coupled to the first conduction terminal of the third transistor.

4. The mixer circuit of claim 3, further comprising:

a first resistor having a first terminal coupled to the second conduction terminal of the first transistor and a second terminal coupled to the power conductor; and a second resistor having a first terminal coupled to the control terminal of the first transistor and a second terminal coupled to the first conduction terminal of the second transistor.

5. The mixer circuit of claim 1, wherein the first signal and the second signal comprise a second differential signal.

6. The mixer circuit of claim 1, further including a fourth transistor having a control terminal and a first conduction terminal coupled to the control terminal of the third transistor and further coupled to conduction terminals of the first differential transistor pair, and a second conduction terminal coupled to the power conductor.

7. The mixer circuit of claim 6, wherein the fourth transistor forms a current mirror with the third transistor and the third transistor is sized to conduct a current that is M times the current conducted by the fourth transistor.

8. The mixer circuit of claim 1, wherein the second transistor forms a current mirror with the first transistor and the first transistor is sized to conduct a current that is M times the current conducted by the second transistor.

9. The mixer circuit of claim 6, further comprising:

a fifth transistor having a control terminal coupled for receiving a bias, a first conduction terminal coupled to the conduction terminals of the first differential transistor pair, and a second conduction terminal coupled to the first conduction terminal of the first transistor;

a sixth transistor having a control terminal coupled for receiving the bias, a first conduction terminal coupled to the conduction terminals of the second differential transistor pair, and a second conduction terminal coupled to the first conduction terminal of the second transistor;

a seventh transistor having a control terminal coupled for receiving the bias, a first conduction terminal coupled to the conduction terminals of the second differential transistor pair, and a second conduction terminal coupled to the first conduction terminal of the third transistor; and an eighth transistor having a control terminal coupled for receiving the bias, a first conduction terminal coupled to the conduction terminals of the first differential transistor pair, and a second conduction terminal coupled to the first conduction terminal of the fourth transistor.

10. A mixer circuit, comprising:

first and second differential transistor pairs having control terminals coupled for receiving a first differential signal;

a first transistor having a control terminal coupled for receiving a component of a second differential signal, a first conduction terminal coupled to common terminals of the first differential transistor pair, and a second conduction terminal coupled to a power conductor;

a second transistor having a control terminal and a first conduction terminal coupled to the control terminal of the first transistor and to common terminals of the second differential transistor pair, and a second conduction terminal coupled to the power conductor;

a third transistor having a control terminal coupled for receiving another component of the second differential signal, a first conduction terminal coupled to the common terminals of the second differential transistor pair, and a second conduction terminal coupled to the power conductor; and a fourth transistor having a control terminal and a first conduction terminal coupled to the control terminal of the third transistor and to the common terminals of the first differential transistor pair, and a second conduction terminal coupled to the power conductor.

11. The mixer circuit of claim 10, wherein the second transistor forms a current mirror with the first transistor and the first transistor is sized to conduct a current that is M times the current conducted by the second transistor.

12. The mixer circuit of claim 10, wherein the fourth transistor forms a current mirror with the third transistor and the third transistor is sized to conduct a current that is M times the current conducted by the fourth transistor.

13. The mixer circuit of claim 10, further comprising:

a fifth transistor having a control terminal coupled for receiving a bias, a first conduction terminal coupled to the common conduction terminals of the first differential transistor pair, and a second conduction terminal coupled to the first conduction terminal of the first transistor;

a sixth transistor having a control terminal coupled for receiving the bias, a first conduction terminal coupled to the common conduction terminals of the second differential transistor pair, and a second conduction terminal coupled to the first conduction terminal of the second transistor;

a seventh transistor having a control terminal coupled for receiving the bias, a first conduction terminal coupled to the common conduction terminals of the second differential transistor pair, and a second conduction terminal coupled to the first conduction terminal of the third transistor; and an eighth transistor having a control terminal coupled for receiving the bias, a first conduction terminal coupled to the common conduction terminals of the first differential transistor pair, and a second conduction terminal coupled to the first conduction terminal of the fourth transistor.

14. The mixer circuit of claim 10, wherein the first, second, third, and fourth transistors are Metal Oxide Semiconductor Field Effect Transistors (MOSFETs).

15. A method of frequency mixing first and second input signals, comprising the steps of:

generating a first current based on the first input signal;

mirroring the first current to generate an amplified first current;

generating a second current that is summed with the first current to provide a summed current that matches the amplified first current; and conducting the amplified first current and the summed current in response to the second input signal.

16. The method of claim 15, wherein the step of conducting the amplified first current and the summed current further includes the step of controlling differential transistor pairs with the second input signal.

17. A method of frequency mixing first and second signals, comprising the steps of:

generating a first current and a second current based on the first signal;

generating an amplified first current from the first current and an amplified second current from the second current;

summing the first current with the amplified second current to provide a first summed current and the second current with the amplified first current to provide a second summed current; and mixing the first and second summed currents in response to the second signal.

18. The method of claim 17, further including the step of generating the first current to match the second current.

19. The method of claim 17, further including the step of generating the amplified first current to match the amplified second current.

* * * * *